United States Patent [19]

Watanabe et al.

[11] Patent Number: 5,023,394

[45] Date of Patent: Jun. 11, 1991

[54] SLIDE FASTENER CHAIN FOR SHIELDING THE ELECTROMAGNETIC WAVE

[75] Inventors: Kozo Watanabe; Yasuhiko Sugimoto, both of Toyama, Japan

[73] Assignee: Yoshida Kogyo K.K., Tokyo, Japan

[21] Appl. No.: 455,174

[22] Filed: Dec. 22, 1989

[30] Foreign Application Priority Data

Dec. 27, 1988 [JP] Japan ............................... 63-328008

[51] Int. Cl.[5] ............................................. H05K 9/00

[52] U.S. Cl. ............................ 174/35 R; 174/35 MS; 174/DIG. 11

[58] Field of Search .......... 174/35 GC, 35 MS, 35 R, 174/DIG. 11, 36; 24/381, 382, 383, 384; 29/408, 409, 410

[56] References Cited

U.S. PATENT DOCUMENTS 2,522,072 9/1950 Tierney ...................... 174/DIG. 11
4,514,586 4/1985 Wagygoner .................. 174/35 MS
4,684,762 8/1987 Gladfelter ............................ 174/36

FOREIGN PATENT DOCUMENTS 48-40084 11/1973 Japan .
56-36921 7/1981 Japan .
58-164290 11/1983 Japan .

*Primary Examiner*—Leo P. Picard
*Assistant Examiner*—Bot Lee Ledynh
*Attorney, Agent, or Firm*—Hill, Van Santen, Steadman & Simpson

[57] ABSTRACT

A slide fastener chain, which possesses an ability to intercept electromagnetic waves, comprises a fastener tape made of a synthetic fiber or a natural fiber which has been coated with a three-ply electroconductive layer of Ni, Cu and Ni, which was produced sequentially by coating nickel, copper and nickel on the fastener tape by electroless plating and the fastener chain includes electroconductive fastener elements being planted along one lateral edge of the fastener tape.

2 Claims, 1 Drawing Sheet

SLIDE FASTENER CHAIN FOR SHIELDING THE ELECTROMAGNETIC WAVE

BACKGROUND OF THE INVENTION

1. Field of the Invention

This invention relates to a slide fastener chain for shielding the electromagnetic wave to be used as in connecting shielding means capable of intercepting such electromagnetic waves as disturbing waves and leaky waves and a method for the production thereof.

2. Description of the Prior Art

For the purpose of protecting household electric appliances, electric devices such as electric precision measuring instruments and high frequency-applied devices, and electric wires and cables against troubles caused by disturbing waves or for the purpose of preventing the leaking out of high-frequency waves generated by such instruments, the practice of enclosing such electric devices in shield cages made of metallic nets and other materials which intercept electromagnetic waves or the practice of wrapping the electric wires and cables in covers made of materials capable of shielding electromagnetic waves is in vogue. In recent years, the troubles caused by electromagnetic waves generated as by office-automating (OA) devices have come to raise a problem. For the purpose of precluding this problem, efforts are continued to develop rooms for shielding such OA devices from electromagnetic waves.

For the purpose of facilitating the opening and closing of such shield cages and shield rooms or the attachment and detachment of shield covers, slide fasteners are used to advantage. The slide fasteners which are used in connecting such shielding means against electromagnetic waves are desired to possess a function of shielding themselves from electromagnetic waves.

As a slide fastener which, though not intended directly for the connection of such shielding means, is capable of shielding itself from electromagnetic waves, Japanese Patent Publication No. SHO 56(1981)-32,921, for example, discloses a slide fastener which has fastener elements attached to a fastener tape made of metallic fibers. This slide fastener is intended to exhibit an improved behavior in corrosion resistance, weathering resistance, durability, mechanical strength, etc. by the using in the fastener tape thereof metallic fibers in the place of heretofore used synthetic fibers or natural fibers. The slide fastener which employs the fastener tape made of metallic fibers as described above, however, suffers from inferior flexibility and high cost. Further, the fact that the strength of attachment of the fastener element is insufficient entails the disadvantage that the element is not stabilized in its attached position and it is not easily attached with a fixed pitch. Japanese Utility Model Publication No. SHO 48(1973)-40,084 discloses a tape for use in a slide fastener, which tape comprises a woven fabric formed by using asbestos fibers and glass fibers respectively as warp and weft, an aluminum coating applied to the surface of the woven fabric by vacuum deposition, and a non-flammable core thread or string formed along the lateral edge of the woven fabric. This tape is intended to be used in slide fasteners for binding to the edges of an opening in fireproof garments or fireproof bags. It pays no respect to the shielding of the slide fastener from electromagnetic waves. Further, since the tape uses a woven fabric formed of nonflammable and nonstretchable inorganic fibers and an aluminum coating layer formed for tightly filling gaps in the texture of the fabric and covering the surface of the fabric, it has the disadvantage that it is deficient in flexibility and strentchability and expensive to manufacture.

A slide fastener chain which is intended solely for use in connecting parts of shielding means against electromagnetic waves is disclosed in Japanese Utility Model Application laid open to public inspection; KOKAI No. SHO 58(1983)-164,290. The slide fastener chain disclosed in the specification is produced by forming a folded part at one end of a shielding means against electromagnetic waves, forming a core string part by placing a flexible core member inside the folded part, and binding electroductive fastener elements to the core string part as electrically connected to the shielding means. The slide fastener chain, therefore, is produced as attached to the shielding means. Since this slide fastener chain requires the core string part to be formed inside the folded part of the shielding means such as of a metallic net obtained by warp knitting a thin wire and binding the fastener elements to the core string part, however, it has the disadvantage that the attachment is troublesome and the flexibility is insufficient.

SUMMARY OF THE INVENTION

An object of this invention, therefore, is to provide a slide fastener chain for shielding means, which slide fastener chain excels in flexibility and in ability to intercept electromagnetic waves.

Another object of this invention is to provide a slide fastener chain which permits as simple attachment of the fastener elements to a fastener tape as in any slide fastener chain of ordinary run and which allows lasting retention of the ability to intercept electromagnetic waves without entailing any such problem as separation of a metallic coating layer.

Yet another object of this invention is to provide a slide fastener chain which excels in ability to intercept electromagnetic waves, flexibility, corrosion resistance, and ability to keep an electroconductive plating layer attached fast to a tape of fibers.

A further object of this invention is to provide a method capable of producing relatively simply and relatively inexpensively a slide fastener chain excelling in flexibility, ability to intercept electromagnetic waves, etc. as described above.

To accomplish the objects described above, according to one aspect of this invention, there is provided a slide fastener chain possessing an ability to intercept electromagnetic waves and comprising a fastener tape made of synthetic fibers or natural fibers and coated with an electroconductive layer of metal or alloy formed by electroless plating and electroconductive fastener elements planted in the lateral edge of the fastener tape.

In accordance with the other aspect of this invention, there is provided a method for the production of a slide fastener chain possessing an ability to intercept electromagnetic waves, which comprises the steps of coating a fastener tape made of synthetic fibers or natural fibers with an electroconductive metal or alloy by electroless plating and subsequently planting electroconductive fastener elements along one lateral edge of the fastener tape.

In the best mode of embodying the slide fastener chain and the method for production thereof, the electroductive coating layer coated on the fastener tape comprises a three-ply (Ni/Cu/Ni) plating layer produced by sequentially coating nickel, copper, and nickel by electroless plating on the fastener tape made of synthetic fibers or natural fibers.

DETAILED DESCRIPTION OF THE INVENTION

In accordance with this invention, a fastener tape is coated with a thin plating layer of an electroconductive metal or alloy by means of electroless plating and subsequently planting electroconductive fastener elements in the coated fastener tape. The fastener tape, therefore, can be vested with electroconductivity without a sacrifice of the flexibility of the fibers as the raw material for the fastener tape and, consequently, the slide fastener chain to be produced excels in flexibility as well as in ability to intercept electromagnetic waves. There may be possibly conceived an idea of effecting the electroless plating after the fastener elements made of metal are planted in the fastener tape. This method, however, proves to be undesirable because it entails the problem that the components of the material of the fastener element dissolve out into the plating liquid and spoil the balance of composition of the plating liquid. It is, therefore, necessary to employ a procedure which comprises subjecting the fastener tape to, electroless plating and thereafter performing the planting of the fastener elements in the fastener tape.

The metal which is deposited on the tape of fibers by the electroless plating is required only to be electroductive. The metals answering this requirement may be broadly classified under the following two groups.

(A) Metals of Group VIII in Periodic Table of the Elements such as, for example, nickel, cobalt, and palladium which have a strong catalytic activity and alloys based on these metals.

(B) Metals of Group I*b* such as, for example, copper, silver, and gold which betray a weak catalytic activity and yet possess a relatively noble electric potential.

The metals belonging to the two groups mentioned above are all usable. However, when a metal of the group of (A) enjoying a strong catalytic activity is used for the electroless plating, it is desirable to use a compound of a strong reducing power as a reducing agent. On the other hand, when a metal of the group of (B) betraying a weak catalytic activity is used, it is desirable to use a compound possessing a weak reducing power as a reducing agent. It is generally favorable to effect the electroless plating with nickel and copper by reason of economy.

Figure 1:
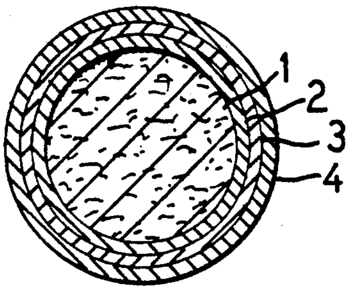
FIG. 1 is a cross sectional view of a yarn being provided with an electrocondutive layer having three plies according to the present invention.

Typical cases of effecting the electroless plating on fibers 1 (FIG. 1) are as follows.

i) Electroless plating with Ni ii) Electroless plating with Cu+ electroless plating with Ni iii) Electroless plating with Ni+ electroless plating with Cu+ electroless plating with Ni In the case of the electroless plating solely with Ni indicated in i), the electroconductivity to be imparted is slightly inferior. In the case of the electroless plating with Cu+ that with Ni indicated in ii), the plating with Cu serves to impart electroconductivity and the Ni plating layer superposed thereon serves to impart excellent corrosion resistance. Particularly in the case of the three-ply plating with Ni+Cu 30 Ni indicated in iii), the lowermost Ni plating layer 2 serves to impart tight adhesiveness of the plating layer to the fibers, the intermediate Cu plating layer 3 to impart electroconductivity, and the uppermost Ni plating layer 4 to enhance corrosion resistance. Therefore, the electroless plating effected in this manner may well be called the optimum method of treatment for preparing the fastener tape capable of intercepting electromagnetic waves from both standpoints of attaining effective plating on a fastener tape made of fibers and effective impartation of electroconductivity thereto.

The electroless plating itself has been known to the art and can be carried out by any of the heretofore well known plating techniques. Generally, this plating is carried out in the electroless plating bath after such pretreatments as surface modification (etching), neutralization, and washing with water and a subsequent series of treatments such as the impartation of responsivity or sensitivity (generally by the use of a stannous chloride type sensitivity-imparting agent) performed for the purpose of facilitating the deposition of a catalytic coating and the catalytic activation or impartation of activity (generally by the use of a platinum-family metal represented by palladium or gold or silver as a catalizing agent or activating agent).

By the electroless plating described above, a very thin plating layer is deposited on individual fibers of the fastener tape. Though the fastener tape has a touch of slightly increased rigidity, it exhibits substantially the same flexibility as before the plating.

The fastener tape on which the electroless plating is performed may be any of the conventionally used fastener tapes made of synthetic fibers or natural fibers. The tapes formed by weaving or knitting yarns made of such synthetic fibers as polyester, polyurethane, nylon, polyacrylonitrile, and rayon and such natural fibers as cotton and silk may be mentioned as examples.

The fastener element to be planted in the fastener tape which has undergone the electroless plating described above may be any of the fastener elements made of electroconductive materials. The elements made of brass, aluminum, nickel, copper, etc. and the elements made of resin and plated with the metals mentioned above may be cited as examples. The individual teeth of the fastener element may be shaped in any of the heretofore conventionally known shapes. The L-shaped or zigzag type element, and the coil type element may be cited as examples.

Figure 2:
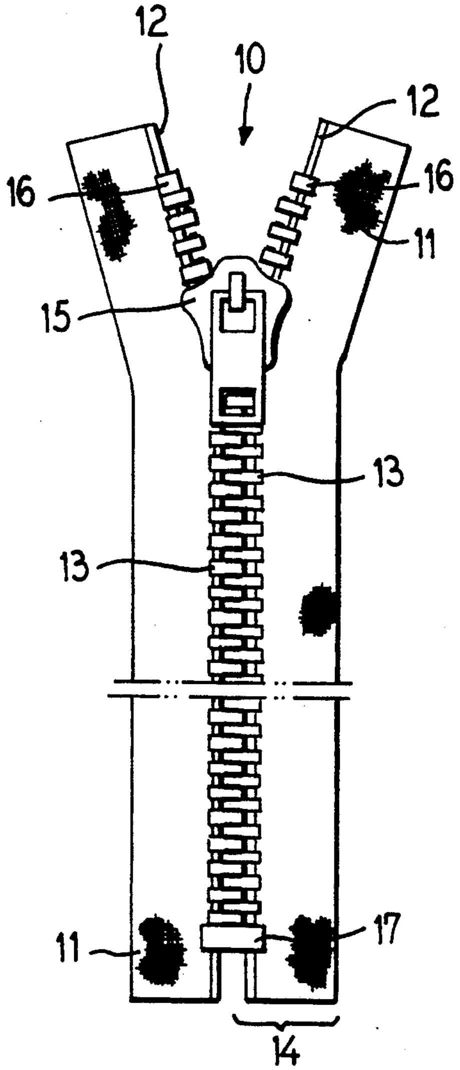
FIG. 2 is a plan view of the slide fastener according to the present invention.

In one lateral edge part of the fastener tape 11 (FIG. 2) on which the electroconductive layer has been deposited as described above, a core string part 12 is formed as generally practised in the art. To this core string part 12, the fastener elements 13 are attached as spaced by a prescribed pitch. The slide fastener chain 14 consequently obtained is further fitted with such necessary parts as slider, 15 an upper stop, 16 and a lower stop 17 to give rise to a finished slide fastener 10 of a prescribed length.

For more specific illustration of the present invention, the following examples are presented which are intended to be merely illustrative of and not in any sense limitative of the invention.

EXAMPLE 1

The surface of a fastener tape made of polyester fibers was modified by an etching treatment performed in an aqueous 5% sodium hydroxide solution at a temperature in the range of 50° to 55° C. for two minutes, then washed with water, neutralized in an aqueous 5% hydrochloric acid solution at normal room temperature for one minute, washed again with water, and treated with an aqueous solution of a tin-containing responsivity-imparting agent at a temperature in the range of 30° to 35° C. for three minutes. The treated fastener tape was washed with water, treated with an aqueous solution of a palladium-containing catalyzing agent at a temperature near 36° C. for three minutes, washed with water, subjected to electroless plating in a nickel plating bath at a temperature of 35° C. and a pH 9.4 for two minutes, and washed with water. Subsequently, the Ni-plated fastener tape was subjected to electroless plating in a copper plating bath at a temperature in the range of 30° to 35° C. for five minutes, then washed with water, treated with a palladium-containing catalyzing agent at 25° C. for 30 seconds, washed with water, and subjected to electroless plating in a nickel plating bath at a temperature in the range of 35° to 38° C. and a pH 9.4 for seven minutes. On the fastener tape thus plated, the fastener elements of brass were planted.

The slide fastener chain obtained as described above excelled in corrosion resistance and in ability to intercept electromagnetic waves and possessed the same flexibility as the fastener tape of ordinary run made of fibers. It further excelled in tight adhesiveness of the plating layer to the fibers. In actual use, it encountered any such problem as peeling of the plating layer. Further, since the fastener element has undergone no plating, the slide fastener chain has no possibility of the plating layer being removed by the movement of the slider, for example.

A slide fastener chain was produced by following the procedure of Example 1 described above, excepting the electroless plating was carried out under the conditions shown below. This slide fastener chain was similarly excellent in flexibility, corrosion resistance, and ability to intercept electromagnetic waves.

Etching: Aqueous 4–6% sodium hydroxide solution, 50° to 55° C., two to three minutes.

Neutralization: 4 to 6% HCl solution, normal room temperature, one to two minutes.

Impartation of responsivity: 30° to 35° C., three to five minutes.

Catalytic activation: 34° to 36°, two to four minutes.

Electroless plating with nickel: pH 9 to 10, 35° to 38° C., one to two minutes.

Electroless plating with copper: 30° C. to 35° C., four to seven minutes.

Catalytic activation: 25° C., 30 seconds.

Electroless plating with nickel: pH 9.4, 35° to 38° C., three to four minutes.

EXAMPLE 2

After the treatments of surface modification, washing with water, neutralization, washing with water, impartation of responsivity, washing with water, catalytic activation, and washing with water were carried out in the same manner as in Example 1, a fastener tape was subjected to electroless plating in the same copper plating bath as used in Example 1 for seven minutes, washed with water, and then subjected to electroless plating in the same nickel plating bath as used in Example 1 at a pH 9.4 and a temperature in the range of 35° to 38° C. for seven mintues. By planting the fastener elements made of brass on the fastener tape consequently obtained, there was obtained a slide fastener chain excelling in flexibility, corrosion resistance, and ability to intercept electromagnetic waves.

EXAMPLE 3

The surface of a fastener tape made of polyester fibers was modified by an etching treatment performed in an aqueous 5% sodium hydroxide solution at 50° to 55° C. for two minutes, then washed with water, neutralized with an aqueous solution containing HCl in a concentration of 50 ml/liter at normal room temperature for one minute, washed with water, and treated for three minutes in an aqueous solution containing a tin-containing responsivity-imparting agent. It was then washed with water, treated with an aqueous solution containing a palladium-containing catalyzing agent at 35° C. for three minutes, washed with water, subjected to electroless plating in a nickel plating bath at a pH 9.4 and a temperature of 35° C. for seven minutes, and washed with water. Consequently, there was obtained a slide fastener chain excelling in flexibility, corrosion resistance, and ability to intercept electromagnetic waves.

What is claimed is:

1. A slide fastener chain, possessing an ability to intercept electromagnetic waves and comprising a fastener tape made of synthetic fibers or natural fibers and being coated with a three-ply electroconductive layer of Ni, Cu and Ni being produced by sequentially coating nickel, copper and nickel on said fastener tape by electroless plating, and electroconductive fastener elements being planted along one lateral edge of said fastener tape.

2. A slide fastener chain according to claim 1, wherein said electroconductive fastener element is an element made of metal or an element made of resin and plated with metal.

* * * * *